(12) United States Patent
Lane

(10) Patent No.: US 7,629,630 B2
(45) Date of Patent: Dec. 8, 2009

(54) ELECTROPOLISHED PATTERNED METAL LAYER FOR SEMICONDUCTOR DEVICES

(75) Inventor: Richard H. Lane, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/989,372

(22) Filed: Nov. 21, 2001

(65) Prior Publication Data

US 2002/0048870 A1   Apr. 25, 2002

Related U.S. Application Data

(62) Division of application No. 09/639,089, filed on Aug. 16, 2000, now Pat. No. 6,455,370.

(51) Int. Cl.
| H01L 29/80 | (2006.01) |
| H01L 31/112 | (2006.01) |
| H01L 27/108 | (2006.01) |
| H01L 29/76 | (2006.01) |
| H01L 29/94 | (2006.01) |

(52) U.S. Cl. .................. 257/256; 257/314; 257/315; 257/324; 257/301

(58) Field of Classification Search ........... 257/256, 257/303, 306, 310, 295–296, 301; 438/386, 438/387, 391, 397, 396, 253, 254, 242, 243, 438/255; 287/308

See application file for complete search history.

(56) References Cited

U.S. PATENT DOCUMENTS

| 5,369,048 | A | | 11/1994 | Hsue | |
| 5,392,189 | A | * | 2/1995 | Fazan et al. | 361/305 |
| 5,565,084 | A | | 10/1996 | Lee et al. | |
| 5,780,333 | A | * | 7/1998 | Kim | 438/238 |
| 5,972,722 | A | | 10/1999 | Visokay et al. | |
| 6,027,860 | A | * | 2/2000 | McClure et al. | 430/314 |
| 6,033,953 | A | * | 3/2000 | Aoki et al. | 438/255 |
| 6,090,697 | A | * | 7/2000 | Xing et al. | 438/618 |
| 6,121,152 | A | | 9/2000 | Adams et al. | |
| 6,127,260 | A | * | 10/2000 | Huang | 438/629 |
| 6,143,646 | A | * | 11/2000 | Wetzel | 438/637 |
| 6,184,081 | B1 | * | 2/2001 | Jeng et al. | 438/253 |
| 6,201,271 | B1 | * | 3/2001 | Okutoh et al. | 257/295 |
| 6,297,527 | B1 | * | 10/2001 | Agarwal et al. | 257/306 |
| 6,320,244 | B1 | | 11/2001 | Alers et al. | |
| 6,358,810 | B1 | * | 3/2002 | Dornfest et al. | 438/396 |
| 6,372,574 | B1 | * | 4/2002 | Lane et al. | 438/253 |
| 6,395,607 | B1 | * | 5/2002 | Chung | 438/312 |
| 6,492,241 | B1 | * | 12/2002 | Rhodes et al. | 438/386 |

* cited by examiner

*Primary Examiner*—Chuong A. Luu
(74) *Attorney, Agent, or Firm*—Dickstein Shapiro LLP

(57) ABSTRACT

An electropolishing process for high resolution patterning of noble metals, such as platinum, for forming various semiconductor devices, such as capacitors or wiring patterns is disclosed.

28 Claims, 8 Drawing Sheets

ELECTROPOLISHED PATTERNED METAL LAYER FOR SEMICONDUCTOR DEVICES

This application is a DIV. of Ser. No. 09/639,089 Aug. 16, 2000 now U.S. Pat. No. 6,455,370.

FIELD OF THE INVENTION

The present invention relates to a method of patterning noble metals by electropolishing for use in semiconductor devices such as capacitors.

BACKGROUND OF THE INVENTION

As the overall dimensions of semiconductor devices continue to decrease, the demand for devices which can be patterned with high-resolution continues to increase. The need for smaller surface area for components, such as capacitors or transistors, along with the requirement to maintain high-reliability electrical connections, have led researchers to seek new materials for such components.

For example, promising candidates for materials for capacitor electrodes in IC memory structures include the eight noble metals (platinum (Pt), palladium (Pd), iridium (Ir), ruthenium (Ru), rhodium (Rh), osmium (Os), silver (Ag) and gold (Au)), as wells as their oxides (for example, ruthenium oxide ($RuO_2$), iridium oxide ($IrO_2$) or osmium oxide ($OsO_2$), among others). The above-mentioned noble metals, of which platinum (Pt) is the most common, are all physically and chemically similar. They are also rather stable, or form conductive oxides, so the capacitance remains unchanged, in oxidizing, reducing, or inert atmospheres at high temperatures. These metals are also resistant to hydrogen damage, and do not affect the dielectric polarization after annealing at high temperatures.

Recently, particular attention has been accorded to platinum (Pt) mainly because platinum has a very low reactivity and is inert to oxidation, thus preventing oxidation of electrodes which would further decrease the capacitance of storage capacitors. Platinum also has a leakage current lower than that of other electrode materials, for example ruthenium oxide or poly-silicon, as well as a high electrical conductivity. Further, platinum is known to have a notably high work function. The work function is an important feature of a DRAM capacitor electrode material and, when quantified, it denotes the energy required to remove one electron from the metal. Advanced DRAM capacitors are characterized by a dominant leakage mechanism, known as the Schottky emission from metal into the dielectric, so that metals, like platinum, with high work function produce less leakage.

The use of platinum as the material of choice for lower capacitor electrodes poses, however, significant problems. One of them arises from the difficulty of etching and/or polishing platinum and the corresponding need to precisely etch the platinum into the shape of the desired capacitor electrode. The etching process, which is repeated many times in the formation of IC chips, typically employs at least one chemical etchant which reacts with, and removes, the film or layer that is etched. Noble metals, such as platinum, however, are not highly reactive with conventional chemical etchants and, consequently, noble metals require specialized etching methods and/or highly-reactive chemical etchants.

Two methods are currently used for platinum etching. The first method is an isotropic etching, such as wet etching with aqua regia (mix ratio of concentrated hydrochloric acid: concentrated nitric acid: water=3:1:4), that offers a very low grade of precision. Consequently, such wet etching is not accurate enough for the fine pattern processing, rendering it difficult to perform submicron patterning of platinum electrodes.

The second method is an anisotropic etching, such as ion beam milling, under which ions, such as argon, generated by a magnetically confined RF or DC plasma bombard an exposed platinum surface. While the ion milling process is used to define and form high resolution patterns from a blanket platinum layer, this process is typically not selective to many masking materials as well as to the layers underlying the platinum layer. Further, the ion milling process removes most materials at about the same rate, making process control very difficult.

Accordingly, there is a need for an improved method of patterning of noble metals, such as platinum, during the formation of IC components, such as capacitors. There is also a need for high-resolution patterning of a noble metal layer during the formation of a lower capacitor electrode, as well as a method for increasing processing accuracy in etching such a noble metal.

SUMMARY OF THE INVENTION

The present invention provides a method for patterning of noble metals employed in the formation of various IC components, such as capacitors, as well as a method for increasing processing accuracy in etching such noble metals.

In an exemplary embodiment, a layer of noble metal is formed as a lower electrode of a capacitor over a conductive barrier layer. A protective layer, such as photoresist, is formed over portions of the conductive barrier layer leaving other portions of the noble metal layer exposed. The exposed portions of the noble metal are subsequently electropolished exposing the underlying barrier layer. The exposed barrier conductive layer is then etched. The protective layer is then removed, and conventional capacitors processing steps are then conducted to form a complete capacitor. In a preferred embodiment, platinum (Pt) is used as the lower electrode.

Additional advantages of the present invention will be more apparent from the detailed description and accompanying drawings, which illustrate exemplary embodiments of the invention.

DETAILED DESCRIPTION OF THE EXEMPLARY EMBODIMENTS

In the following detailed description, reference is made to various specific embodiments in which the invention may be practiced. These embodiments are described with sufficient detail to enable those skilled in the art to practice the invention, and it is to be understood that other embodiments may be employed, and that structural, logical, and electrical changes may be made without departing from the spirit or scope of the present invention.

The term "substrate" used in the following description may include any semiconductor-based structure that has an exposed silicon surface. Structure must be understood to include silicon, silicon-on insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide. When reference is made to substrate in the following description, previous process steps may have been utilized to form regions or junctions in or on the base semiconductor or foundation.

The term "noble metal" is intended to include not only elemental noble metal, but noble metal with other trace metals or in various alloyed combinations with other metals as known in the semiconductor art, as long as such alloy retains the physical and chemical properties of the noble metal.

The present invention provides a method for patterning of noble metals, such as platinum, during the formation of IC components, such as capacitors or wiring patterns. The invention uses electropolishing for high-resolution patterning of a noble metal layer to form various geometric features of semiconductor memory structures, such as a lower capacitor electrode. The method of the present invention also increases the processing accuracy in patterning noble metals.

Figure 1:
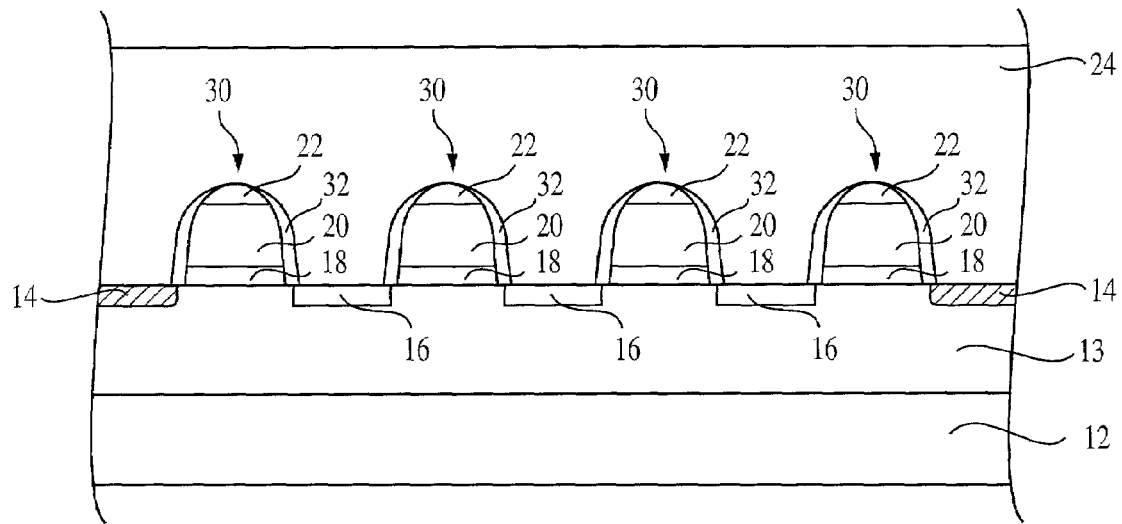
FIG. 1 is schematic cross-sectional view of a portion of a memory DRAM device, in which a lower capacitor platinum electrode will be formed according to a method of the present invention.

Referring now to the drawings, where like elements are designated by like reference numerals, FIG. 1 depicts a memory cell construction for a DRAM at an intermediate stage of the fabrication, in which a pair of memory cells having respective access transistors are formed on a substrate 12. The FIG. 1 structure includes the substrate 12 having a well 13, which is typically doped to a predetermined conductivity, for example p-type or n-type depending on whether NMOS or PMOS transistors will be formed therein. The structure further includes field oxide regions 14, conventional doped active areas 16 for use as source/drain regions, and a pair of gate stacks 30, all formed according to well-known semiconductor processing techniques. The gate stacks 30 include an oxide layer 18, a conductive layer 20, such as polysilicon, nitride spacers 32 and a nitride cap 22.

Above the gate oxide region 18, the polysilicon gates 20, and the protective nitride regions 22,32, a first insulating layer 24 (FIG. 1) is disposed. Insulating layer 24 could be, for example, silicon oxide, borophosphosilicate glass (BPSG), borosilicate glass (BSG), or phosphosilicate glass (PSG).

Figure 2:
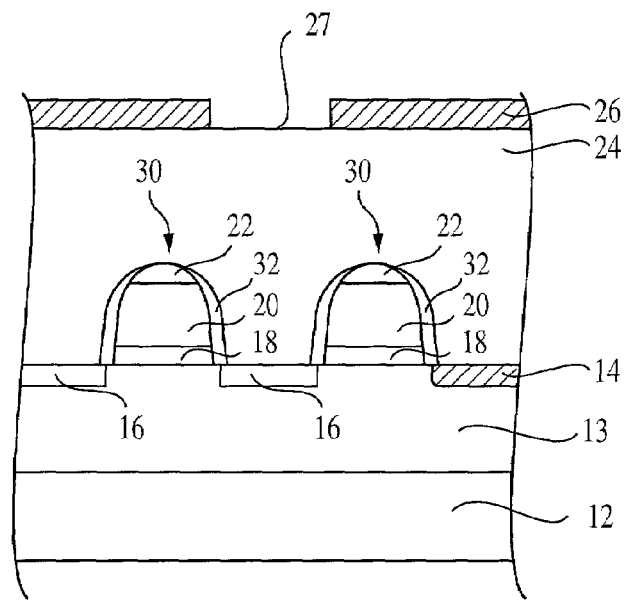
FIG. 2 is a schematic cross-sectional view of the FIG. 1 device at a stage of processing subsequent to that shown in FIG. 1.
Figure 3:
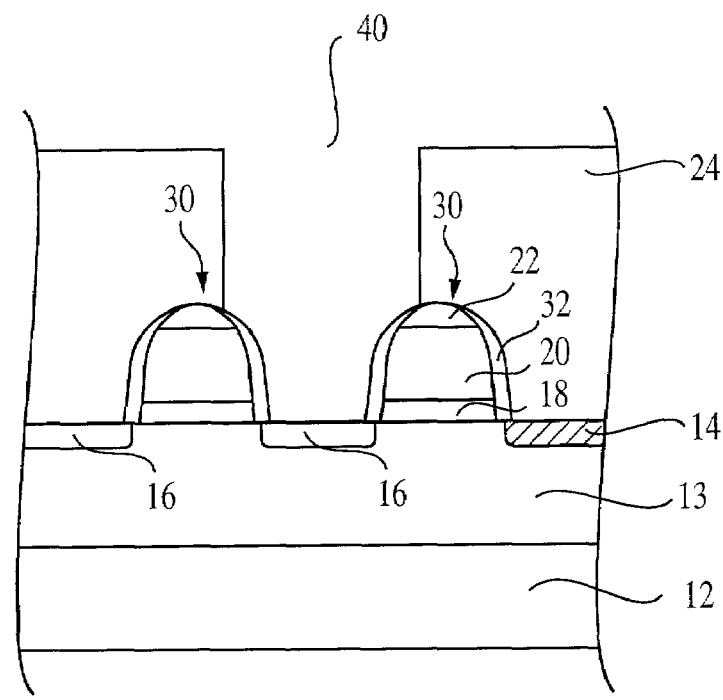
FIG. 3 is a schematic cross-sectional view of the FIG. 1 device at a stage of processing subsequent to that shown in FIG. 2.

Reference is now made to FIG. 2, which for simplicity illustrates only a lateral portion, for example the right side portion, of FIG. 1. This is a region where a contact plug and an overlying capacitor structure 100 (FIG. 14), including a lower platinum electrode formed according to a method of the present invention, will be formed. To create a contact opening 40 (FIG. 3) into the substrate 12 through the first insulating layer 24, a photoresist material 26 (FIG. 2) is deposited and patterned using conventional photolithography steps. After patterning, an initial opening 27 (FIG. 2) is formed in photoresist layer 26 for subsequent oxide etching. The first insulating layer 24 of FIG. 2 is then etched, to form a contact opening 40, and the photoresist layer 26 is removed, as shown in FIG. 3. The contact opening 40 extends to a source/drain region 16 provided in well 13 of substrate 12.

Figure 4:
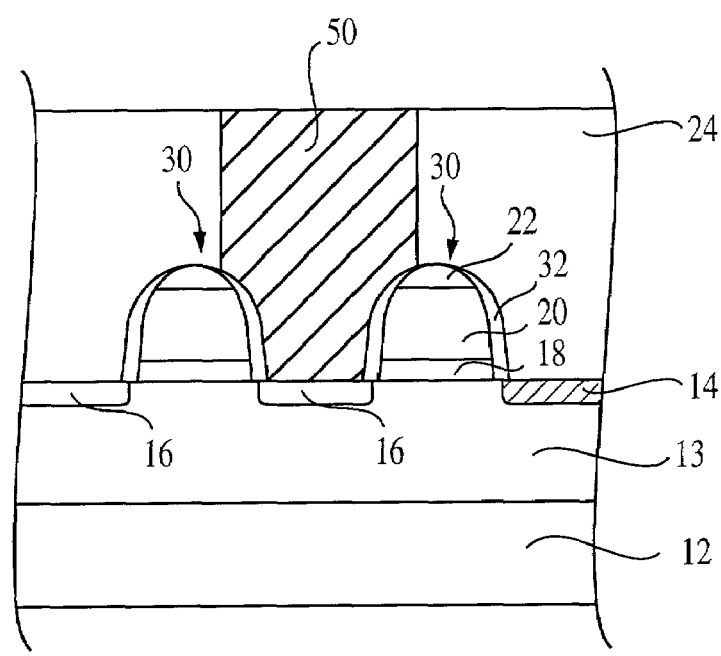
FIG. 4 is a schematic cross-sectional view of the FIG. 1 device at a stage of processing subsequent to that shown in FIG. 3.
Figure 5:
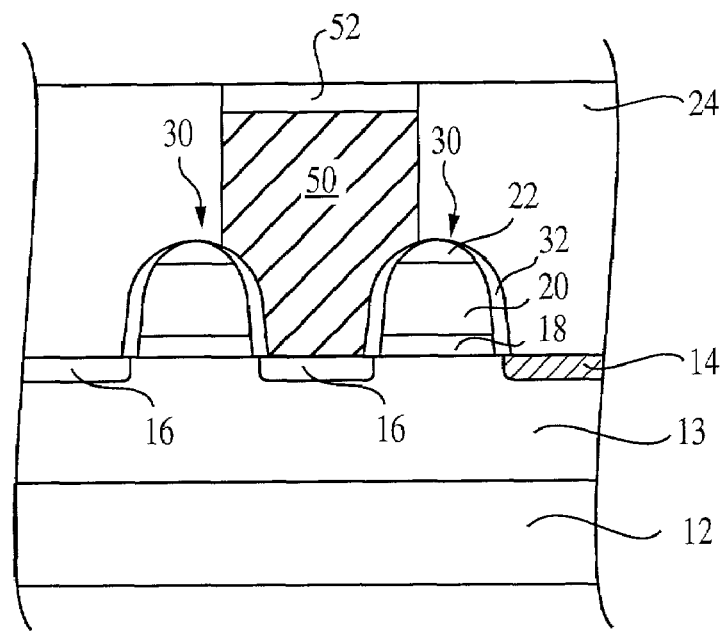
FIG. 5 is a schematic cross-sectional view of the FIG. 1 device at a stage of processing subsequent to that shown in FIG. 4.

Next, contact opening 40 (FIG. 3) is filled with a conductive material, such as doped polysilicon, that is planarized down to or near the planar surface of the first insulating layer 24, to form a polysilicon plug or filler 50, as illustrated in FIG. 4. The polysilicon plug 50 is then anisotropically etched until its top surface is recessed below the planar surface of the first insulating layer 24, so that a barrier layer 52 (FIG. 5) can be deposited and planarized, as shown in FIG. 5. The barrier layer 52, preferably of titanium (Ti), is formed on the polysilicon plug 50 by CVD, PVD, sputtering or evaporation, to a thickness of about 60 to about 200 Angstroms. The titanium barrier layer 52 will form titanium silicide ($TiSi_2$) during a later high temperature anneal.

Although the present invention is described with reference to forming a capacitor 100 (FIG. 14) over the polysilicon plug 50, including the barrier layer 52, it must be understood that the existence of the barrier layer 52 is optional, and the present invention also applies to capacitors formed over polysilicon plugs without protective barrier layer 52.

Figure 6:
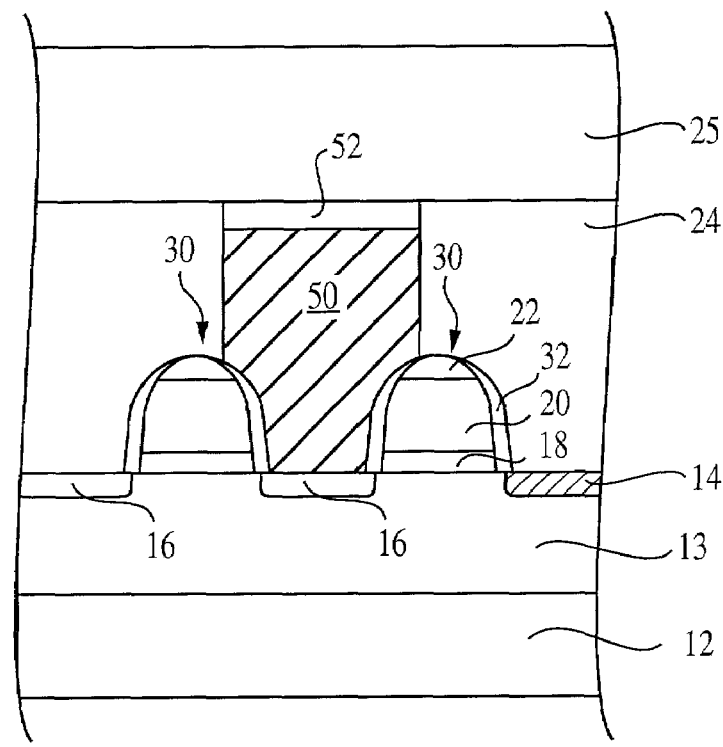
FIG. 6 is a schematic cross-sectional view of the FIG. 1 device at a stage of processing subsequent to that shown in FIG. 5.

FIG. 6 illustrates the deposition of a second insulating layer 25, which could be, for example, a silicon oxide, borophosphosilicate glass (BPSG), borosilicate glass (BSG), phosphosilicate glass (PSG), or tetraethylortho silicate (TEOS). The second insulating layer 25 is deposited over the barrier layer 52 and the first insulating layer 24. Again, using the same fabrication technique as that used for the formation of contact opening 40 (FIG. 3) through the first insulating layer 24, a contact opening 41 (FIG. 7) is formed through the second insulating layer 25.

Figure 7:
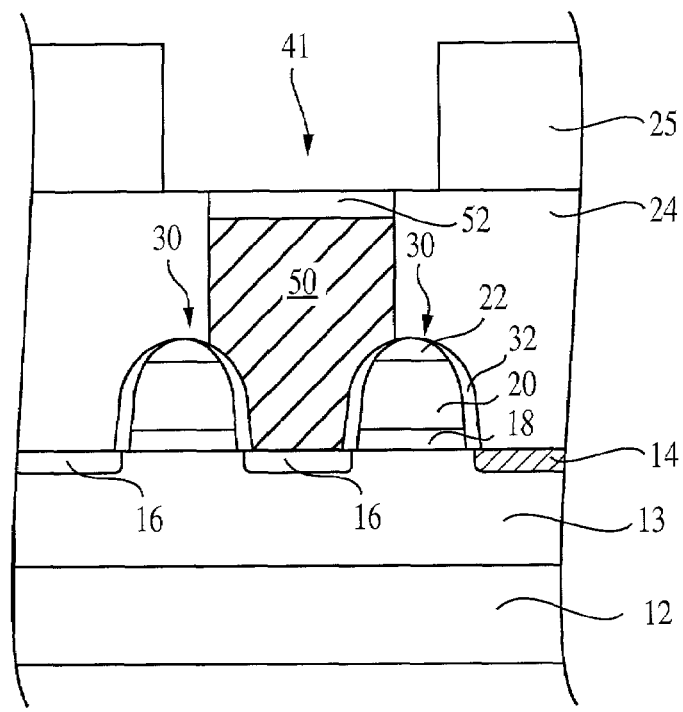
FIG. 7 is a schematic cross-sectional view of the FIG. 1 device at a stage of processing subsequent to that shown in FIG. 6.
Figure 8:
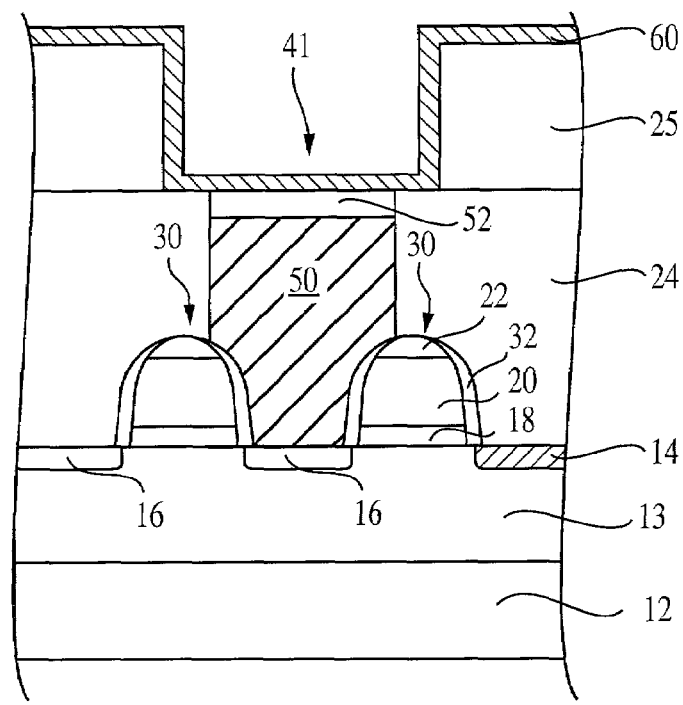
FIG. 8 is a schematic cross-sectional view of the FIG. 1 device at a stage of processing subsequent to that shown in FIG. 7.

Subsequent to the formation of contact opening 41 of FIG. 7, a material is deposited by using plasma, reactive sputtering or a conventional chemical vapor deposition to form a barrier conductive layer 60, as shown in FIG. 8, to a thickness of about 100 Angstroms. Preferred materials for the barrier conductive layer 60 are tantalum, tantalum nitride, titanium, or titanium nitride, among others. A characteristic of the material forming the barrier conductive layer 60 is its good conductivity, which allows the material to provide an electrical path for later electropolishing, as it will be described below. Barrier conductive materials, such as tantalum nitride, also suppress the diffusion of the silicon at the polysilicon-barrier conductive material interface, while offering a low resistivity and low contact resistance between the silicon and the barrier conductive layer.

Figure 9:
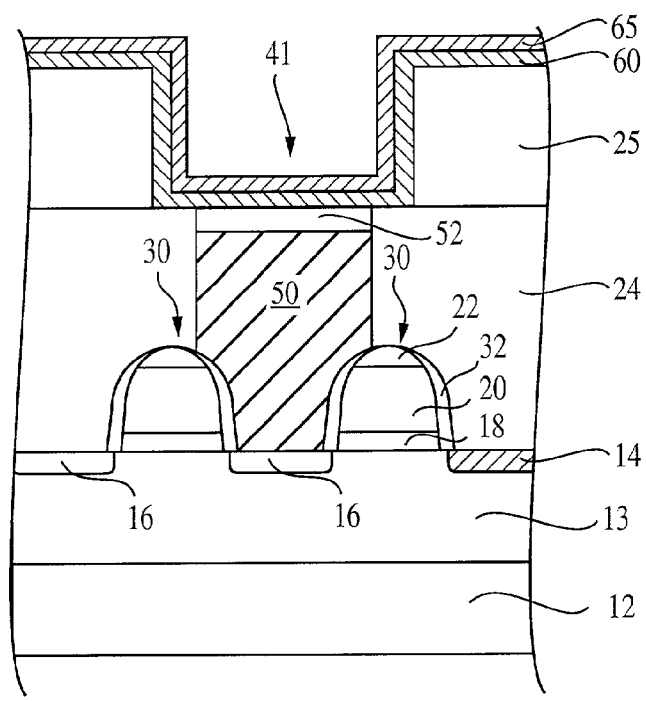
FIG. 9 is a schematic cross-sectional view of the FIG. 1 device at a stage of processing subsequent to that shown in FIG. 8.

After deposition of the barrier conductive layer 60, a noble metal layer 65 is formed over the barrier conductive layer 60, as shown in FIG. 9. Although any of the eight noble metals mentioned above, along with their alloys and oxides, may be used for forming the noble metal layer 65, platinum is preferred and, thus, further reference to the noble metal layer 65 will be to platinum layer 65. A portion of platinum layer 65 will form a lower platinum electrode 70 (FIGS. 11-14) of capacitor 100 (FIG. 14).

Platinum layer 65 (FIG. 9) could be formed over the barrier conductive layer 60 by any conventional method, such as deposition or sputtering, to a thickness of approximately 50 to 300 Angstroms, more preferably of about 100 Angstroms.

Figure 10:
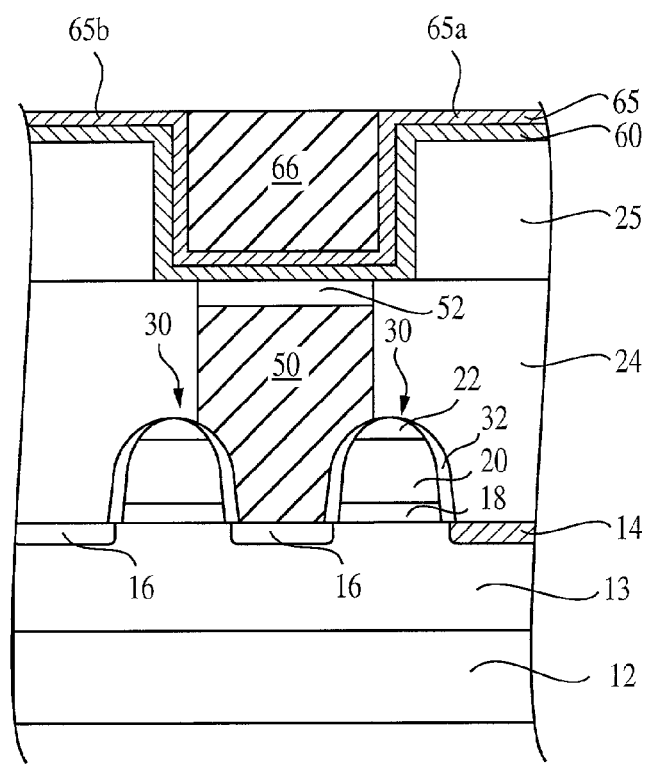
FIG. 10 is a schematic cross-sectional view of the FIG. 1 device at a stage of processing subsequent to that shown in FIG. 9.

Referring now to FIG. 10, contact opening 41 (FIG. 9) is next filled with a photoresist material, by, for example, spin coating at room temperature and then solidifying it. The photoresist material, which can be any photochemical resin used in the semiconductor industry, is then planarized by CMP down to or near the planar surface of the platinum layer 65 to form a photoresist plug 66. The photoresist plug 66 acts as a protective barrier for portions of the platinum layer 65 which contact the vertical walls of the contact opening 41, as well as for the horizontal portion of the platinum layer 65 which is situated above the polysilicon plug 50. The photoresist plug 66 does not protect, however, horizontal portions of platinum layer 65 that are situated above the second insulating layer 25, that is, exposed platinum portions 65a, 65b, illustrated in FIG. 10.

Figure 11:
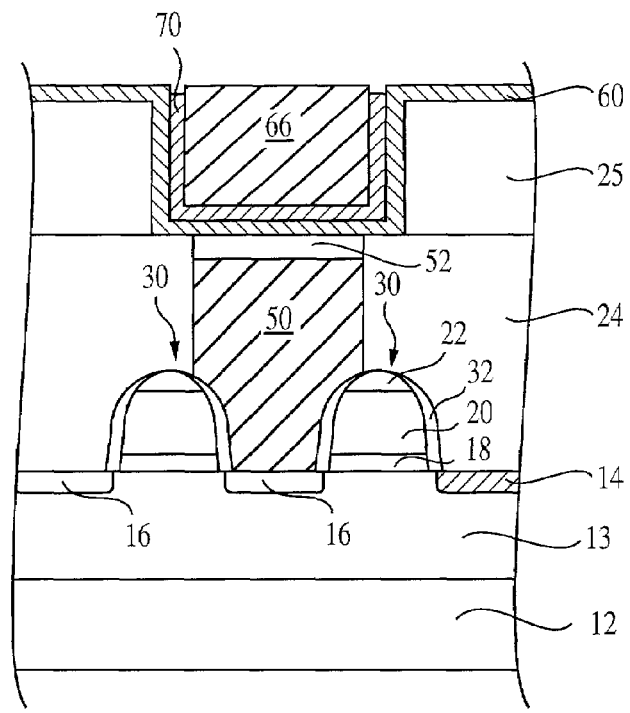
FIG. 11 is a schematic cross-sectional view of the FIG. 1 device at a stage of processing subsequent to that shown in FIG. 10.

After to the formation of the photoresist plug 66, the resulting structure is introduced into an electropolishing system and immersed into an electrolytic chemical bath to remove the exposed platinum portions 65a, 65b formed over the second dielectric layer 25, and to form lower platinum electrode 70, as illustrated in FIG. 11. It must be noted that the structure of FIG. 10 is electropolished for a time sufficient to allow the top surface of the lower platinum electrode 70 (FIG. 11) to be recessed down to the planar surface of the second insulating layer 25. During the electropolishing process, a voltage potential is applied to the conductive layer 60.

Although electropolishing processes are known, a brief description of the process as used in the invention is believed to be helpful for a better understanding of the present invention. Electropolishing, also called "reversed plating," is the electrolytic removal of a metal, such as platinum, in a highly ionic solution by means of an electrical potential and current. Electropolishing is accomplished by connecting the metal part to be processed, that is the exposed platinum portions 65a, 65b (FIG. 10), to the positive terminal (the anode) of a DC power supply through conductive layer 60. Substrate 12, including the exposed platinum portions 65a, 65b, is then immersed in a heated electrolytic bath (a mixture of phosphoric and sulfuric acids) containing metal plates, which typically line the edges of the processing tank and are connected to the negative terminal (the cathode). Since the barrier conductive layer 60 (FIGS. 8-14) is preferably formed of an electrically conductive material, such as tantalum, the barrier conductive layer 60 also acts as a metal plate connected to the cathode. In any event, the cathode is usually made out of metal shaped in such a way as to provide even current densities to the surface of the metal part to be processed, that is the exposed platinum portions 65a, 65b.

The electropolishing effect occurs because, as the current is applied, platinum from the exposed platinum portions 65a, 65b changes its characteristics and reacts with the electrolytes from the heated electrolytic bath to form a film (not shown) at the surface of platinum. This film, also called anode film, essentially conforms to the general contour of the surface of the exposed platinum portions 65a, 65b. As the current is applied, the electrolytic bath, which becomes an electropolishing solution, becomes thicker and acquires the characteristics of an insulator or resistor. It is important to note that, the greater the film thickness, the higher the resistance or insulation properties of the film. This means that the platinum closest to the surface of the exposed platinum portions 65a, 65b has a very thick covering of anode film solution and, for the most part, is electrically cut off from the cathode. Overall, the amount of platinum removed depends upon the composition of the platinum, the temperature and the agitation of the electrolytic bath, the spatial relationship of the anode and cathode, the intensity of current, as well as the length of time the current is flowing.

After a suitable amount of time (depending upon the thickness and the properties of the platinum portions 65a, 65b) the power is turned off and the substrate 12, with the anode film formed over the conductive barrier layer 60 (FIG. 12), is removed from the processing tank into a first rinse tank, filled with deionized water, where the anode film is rinsed off by immersion. Finally, substrate 12, without the anode film, is taken to a second rinse station, also filled with deionized water, to remove any remaining traces of the anode film, and to obtain the structure of FIG. 11 with portions 65a, 65b of platinum layer removed and with lower platinum electrode 70 protected by the photoresist plug 66.

Figure 12:
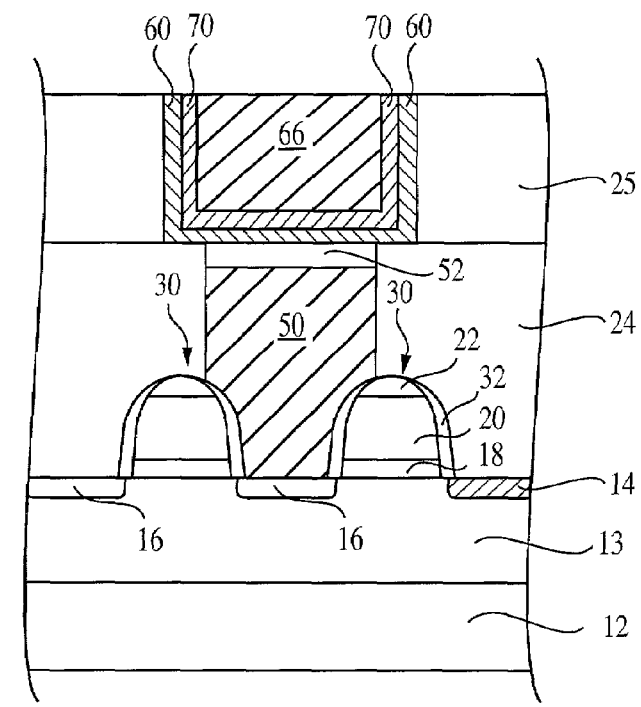
FIG. 12 is a schematic cross-sectional view of the FIG. 1 device at a stage of processing subsequent to that shown in FIG. 11.

Reference is now made to FIG. 12. After the electropolishing of platinum, the resulting structure is chemically mechanically polished (CMP) so that horizontal portions of the conductive barrier layer 60 situated over the second insulating layer 25 (FIG. 11), along with the upper surface of the photoresist plug 66, are removed as illustrated in FIG. 12.

Figure 13:
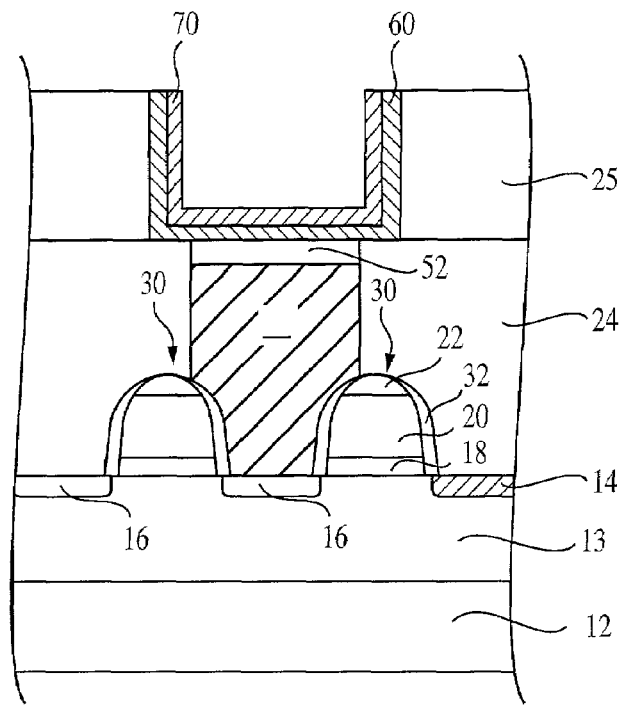
FIG. 13 is a schematic cross-sectional view of the FIG. 1 device at a stage of processing subsequent to that shown in FIG. 12.
Figure 14:
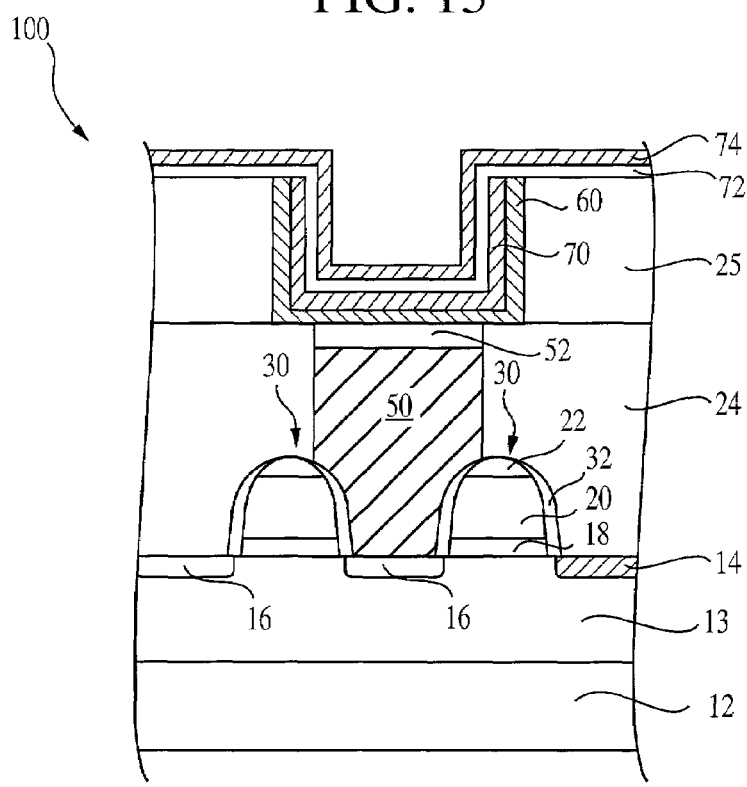
FIG. 14 is a schematic cross-sectional view of the FIG. 1 device at a stage of processing subsequent to that shown in FIG. 13.

Next, the chemically mechanically polished photoresist plug 66 is removed by using conventional techniques, such as ashing or etching, to form the structure of FIG. 13. Upon removal of the photoresist plug 66, the processing steps for the fabrication of the capacitor 100 (FIG. 14) proceed according to well-known methods of the prior art. As such, a dielectric layer 72 (FIG. 14) is first formed over the lower platinum electrode 70 by conventional methods, for example deposition or spin coating, to a thickness of about 100 Angstroms. Increasingly popular materials for the dielectric layer 72 are the ferroelectrics, such as PZT (lead (Pb) zirconate titanate) or $BaTiO_2$ (barium titanite). However, other conventional insulating materials, such as silicon oxides, silicon nitrides, silicon oxynitrides or carbides, may be used also, in accordance with the processing requirements and the characteristics of the particular IC device. Further, high-dielectric constant materials, such as titanium oxide ($TiO_2$) barium oxide (BaO) tantalum oxide ($Ta_2O_5$) or ruthenium oxide ($Ru_2O_3$), may be used also, again according to the characteristics of the particular IC devices to be constructed at subsequent steps.

An upper electrode 74 (FIG. 14) is next formed overlying the dielectric layer 72 by any conventional method, such as deposition or sputtering, to a thickness of approximately 50 to 300 Angstroms, more preferably of about 100 Angstroms. The upper electrode 74 may be formed of a noble metal, such as platinum, or of any other suitable material, for example, doped polysilicon or conventional metals. This way, capacitor 100 (FIG. 14) is formed of the conductive barrier layer 60, the upper platinum electrode 70 formed by electropolishing, the dielectric layer 72, and the upper electrode 74. To this end, further well-known processing steps to create a functional memory cell containing the capacitor 100 (FIG. 14) may now be carried out.

Figure 15:
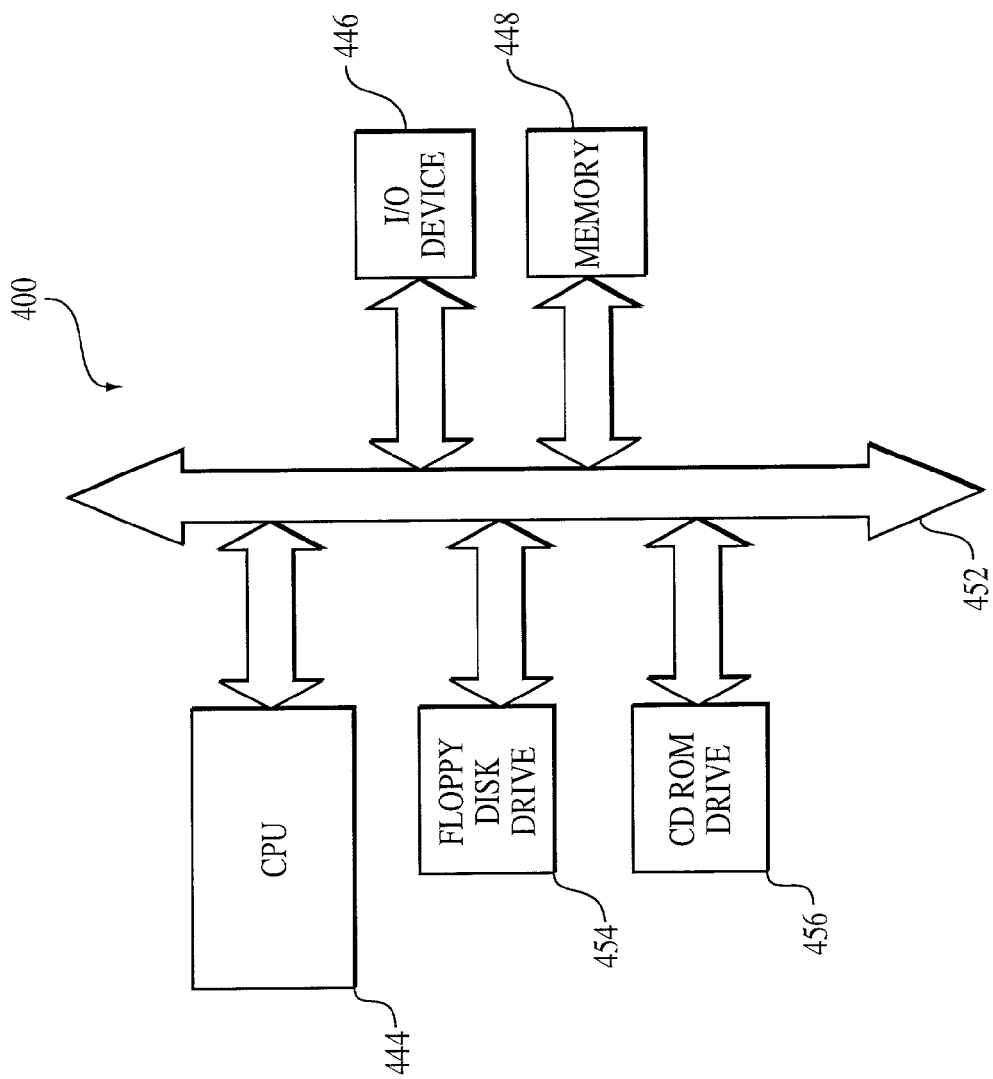
FIG. 15 is an illustration of a computer system having a memory device with a capacitor having a lower platinum electrode constructed in accordance with the present invention.

A typical processor based system 400 which includes a memory circuit 448, for example a DRAM, SRAM, or MCM, containing a capacitor including a lower platinum electrode constructed according to the present invention is illustrated in FIG. 15. A processor system, such as a computer system, generally comprises a central processing unit (CPU) 444, such as a microprocessor, a digital signal processor, or other programmable digital logic device, which communicates with an input/output (I/O) device 446 over a bus 452. The memory 448 communicates with the central processing unit 444 over bus 452.

In the case of a computer system, the processor system may include peripheral devices such as a floppy disk drive 454 and a compact disk (CD) ROM drive 456 which also communicate with CPU 444 over the bus 452. Memory 448 is preferably constructed as an integrated circuit, which includes at least one capacitor having a lower electrodes formed of a noble metal patterned by electropolishing, as previously described with respect to the embodiments described in connection with FIGS. 1-14. The memory 448 may also be combined with the processor, e.g. CPU 444, on a single integrated circuit chip.

Although the exemplary embodiment described above refers to the formation of a lower platinum electrode as part of the capacitor 100 (FIGS. 1-14), it must be understood that the present invention contemplates the patterned formation of other geometrical noble metal features that form various IC components, for example, patterned wiring, and it is not limited to capacitors. Rather, the present invention contemplates patterning of noble metals by electropolishing to form various features as part of any IC device.

Also, although the exemplary embodiment described above refers to a container capacitor, such as capacitor 100 of FIG. 14, the invention is further applicable to any other type of IC capacitors currently used in the semiconductor industry. As such, the method of the present invention contemplates ferroelectric capacitors, MIM (metal-insulator-metal) capacitors, MIS (metal-insulator-semiconductor) capacitors or high-dielectric constant capacitors, among others, according to the characteristics of the particular IC device.

Further, although the exemplary embodiment described above refers to platinum as the preferred material for electropolishing, as explained above, any of the other seven noble metals and/or their alloys and oxides may be used also and, thus, the invention must not be limited to the use of platinum.

Accordingly, the above description and drawings are only to be considered illustrative of exemplary embodiments which achieve the features and advantages of the present invention. Modification and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desired to be protected by Letters Patent of the United States is:

1. A memory cell comprising:
   a transistor including a gate fabricated on a semiconductor substrate and including a source/drain region in said semiconductor substrate disposed adjacent to said gate;
   an insulating layer provided over said substrate; and
   a container capacitor including a first metal barrier layer, a lower electrode over said first metal barrier layer, a dielectric layer over said lower electrode, and an upper electrode over said dielectric layer, said upper electrode comprising doped polysilicon, and said lower electrode having a surface aligned over said source/drain region,
   wherein said lower electrode comprises an electropolished patterned metal layer which is situated fully within said insulating layer,
   wherein said first metal barrier layer is fully within said insulating layer,
   wherein said electropolished patterned metal layer has a thickness of about 50 to about 300 Angstroms,
   and wherein said dielectric layer is in contact with said insulating layer.

2. The memory cell of claim 1, wherein said electropolished patterned metal layer contains a material selected from the group consisting of noble metals, noble metal alloys and noble metal oxides.

3. The memory cell of claim 2, wherein said electropolished patterned metal layer contains a noble metal.

4. The memory cell of claim 2, wherein said electropolished patterned metal layer is a platinum layer.

5. The memory cell of claim 1, wherein said electropolished patterned metal layer has a thickness of approximately 100 Angstroms.

6. A processor-based system comprising:
   a processor; and
   an integrated circuit coupled to said processor, at least one of said integrated circuit and said processor comprising a container capacitor provided within an insulating layer, said container capacitor including a first metal barrier layer, a lower electrode and an upper electrode, said lower electrode comprising an electropolished patterned metal layer having a thickness of approximately 50 to 300 Angstroms, wherein a top surface of said electropolished patterned metal layer and said first metal barrier layer are at the same level with a top surface of said insulating layer such that said lower electrode and said first metal barrier layer do not extend above the top surface of said insulating layer, and said upper electrode comprising doped polysilicon.

7. The processor-based system of claim 6, wherein said electropolished patterned metal layer contains a material selected from the group consisting of noble metals, noble metal alloys and noble metal oxides.

8. The processor-based system of claim 7, wherein said electropolished patterned metal layer contains a noble metal.

9. The processor-based system of claim 8, wherein said electropolished patterned metal layer is a platinum layer.

10. The processor-based system of claim 6, wherein said electropolished patterned metal layer has a thickness of approximately 100 Angstroms.

11. The processor-based system of claim 6, wherein said integrated circuit is a memory module.

12. The processor-based system of claim 11, wherein said memory module is a DRAM memory.

13. The processor-based system of claim 11, wherein said memory module is a SRAM memory.

14. The processor-based system of claim 11, wherein said memory module is a MCM memory.

15. A container capacitor comprising:
   a first metal barrier layer provided fully within a first insulating layer, said barrier layer having a bottom wall and vertical sidewalls extending rectangularly upwardly therefrom;

a lower electrode provided fully within said first insulating layer and over said first metal barrier layer, said lower electrode comprising an electropolished patterned metal layer having a bottom wall and vertical sidewalls extending rectangularly upwardly therefrom;

a second insulating layer provided over said electropolished patterned metal layer and in contact with said first insulating layer; and an upper electrode provided over said second insulating layer.

16. The container capacitor of claim 15, wherein said electropolished patterned metal layer contains a material selected from the group consisting of noble metals, noble metal alloys and noble metal oxides.

17. The container capacitor of claim 15, wherein said electropolished patterned metal layer has a thickness of approximately 50 to 300 Angstroms.

18. The container capacitor of claim 15, wherein said electropolished patterned metal layer has a thickness of approximately 100 Angstroms.

19. A container capacitor comprising:

an insulating layer provided over a substrate, said insulating layer containing an opening;

a tantalum nitride barrier conductive layer provided at a bottom of said opening;

a lower electrode provided over said tantalum nitride barrier conductive layer, said lower electrode comprising an electropolished patterned metal layer having a bottom and vertical sidewalls extending upwardly from said bottom such that said lower electrode is situated fully within said insulating layer, said lower electrode having a thickness of approximately 100 Angstroms;

a dielectric material provided over said electropolished patterned metal layer and in contact with said insulating layer; and an upper electrode comprising doped polysilicon provided over said dielectric material and wherein said lower electrode, said dielectric material and said upper electrode form said container capacitor.

20. A capacitor structure comprising:

an insulating layer provided over a substrate, the insulating layer including a contact opening, the contact opening having a first height;

a barrier conductive layer provided within the contact opening, the barrier conductive layer being disposed along a bottom and sidewalls of the contact opening, wherein the barrier conductive layer has a first thickness and wherein a length of upwardly extending portions of the barrier conductive layer that are disposed along the sidewalls of the contact opening is equal to the first height;

a lower platinum electrode provided over the barrier conductive layer, the lower platinum electrode being disposed along a bottom portion and sidewall portions of the barrier conductive layer, wherein a length of upwardly extending portions of the lower platinum electrode that are disposed along the sidewall portions of the barrier conductive layer is equal to the first height minus the first thickness;

a dielectric layer provided over the lower platinum electrode, the dielectric layer being disposed along a bottom portion and sidewall portions of the lower platinum electrode and on an upper surface of the barrier conductive layer and an upper surface of the substrate; and a second platinum electrode provided over the dielectric layer, the second platinum electrode being disposed along a bottom portion, sidewall portions and an upper surface of the dielectric layer.

21. The memory cell of claim 1, further comprising a second metal barrier layer below and in contact with the first metal barrier layer.

22. The processor-based system of claim 6, wherein the integrated circuit further comprises a second metal barrier layer below and in contact with the first metal barrier layer.

23. The container capacitor of claim 15, further comprising a second metal barrier layer below and in contact with the first metal barrier layer.

24. The capacitor structure of claim 20, further comprising a metal barrier layer below and in contact with the barrier conductive layer.

25. The container capacitor of claim 19, further comprising a metal barrier layer below and in contact with the tantalum nitride barrier conductive layer.

26. The container capacitor of claim 19, wherein said electropolished patterned lower electrode contains a material selected from the group consisting of noble metals, noble metal alloys and noble metal oxides.

27. The container capacitor of claim 19, wherein said electropolished patterned lower electrode contains a noble metal.

28. The container capacitor of claim 19, wherein said electropolished patterned lower electrode is a platinum layer.

* * * * *

UNITED STATES PATENT AND TRADEMARK OFFICE
CERTIFICATE OF CORRECTION

| | | |
|---|---|---|
| PATENT NO. | : 7,629,630 B2 | |
| APPLICATION NO. | : 09/989372 | |
| DATED | : December 8, 2009 | |
| INVENTOR(S) | : Richard H. Lane | |

It is certified that error appears in the above-identified patent and that said Letters Patent is hereby corrected as shown below:

In column 8, line 22, in Claim 4, delete "claim 2," and insert -- claim 3, --, therefor.

Signed and Sealed this

Sixteenth Day of February, 2010

David J. Kappos
*Director of the United States Patent and Trademark Office*